United States Patent
Karlsson

(10) Patent No.: US 7,095,779 B2
(45) Date of Patent: Aug. 22, 2006

(54) METHOD AND APPARATUS FOR AUTOMATIC JAMMER FREQUENCY CONTROL OF SURGICAL REACTIVE JAMMERS

(75) Inventor: Lars Karlsson, Santa Clara, CA (US)

(73) Assignee: Networkfab Corporation, Santa Clara, CA (US)

( * ) Notice: Subject to any disclaimer, the term of this patent is extended or adjusted under 35 U.S.C. 154(b) by 0 days.

(21) Appl. No.: 11/201,422

(22) Filed: Aug. 10, 2005

(65) Prior Publication Data

US 2006/0153281 A1    Jul. 13, 2006

Related U.S. Application Data

(63) Continuation-in-part of application No. 10/912,976, filed on Aug. 6, 2004.

(60) Provisional application No. 60/649,920, filed on Feb. 3, 2005.

(51) Int. Cl.
*H04B 1/69* (2006.01)
*H04K 3/00* (2006.01)

(52) U.S. Cl. ............................. 375/130; 342/14; 455/1

(58) Field of Classification Search ........ 375/130–135, 375/138, 139, 141, 144–146, 260, 262, 344, 375/346, 350; 455/1; 342/14, 17; 398/391
See application file for complete search history.

(56) References Cited

U.S. PATENT DOCUMENTS

| | | | | |
|---|---|---|---|---|
| 6,036,351 A | * | 3/2000 | Wagstaff | 708/321 |
| 6,335,953 B1 | * | 1/2002 | Sanderford et al. | 375/344 |
| 2002/0051498 A1 | * | 5/2002 | Thomas et al. | 375/262 |
| 2003/0103589 A1 | * | 6/2003 | Nohara et al. | 375/350 |
| 2004/0042568 A1 | * | 3/2004 | Rowitch | 375/346 |
| 2004/0243258 A1 | * | 12/2004 | Shattil | 700/73 |

* cited by examiner

*Primary Examiner*—Don N. Vo
(74) *Attorney, Agent, or Firm*—Steins & Associates, P.C.

(57) ABSTRACT

A Method and Apparatus for Automatic Jammer Frequency Control of Surgical Reactive Jammers is disclosed. The system and method to autonomously and selectively jam frequency-hopping signals in near real-time. The system has the ability to automatically detect short duration signals (such as those output from frequency hoppers), to automatically determine if detected signal(s) should be jammed, and subsequently to automatically and extremely quickly activate the jamming transmitter on the frequency-hopper transmitter's frequency. Furthermore, the system improves upon the FFT-based front-end system by incorporating a module that automatically and iteratively compares the digital FFT results to the analog RF signal to the arrive at a total frequency offset between the FFT results and the analog signal so that the transmitted jamming signal will be more accurately applied on the desired or target frequency. Finally, the system provides a programmable user interface so that operators can set up the system to act autonomously as intended, such that operator intervention is unnecessary when the system is placed in jamming operation mode.

18 Claims, 2 Drawing Sheets

FIGURE 1 – PRIOR ART
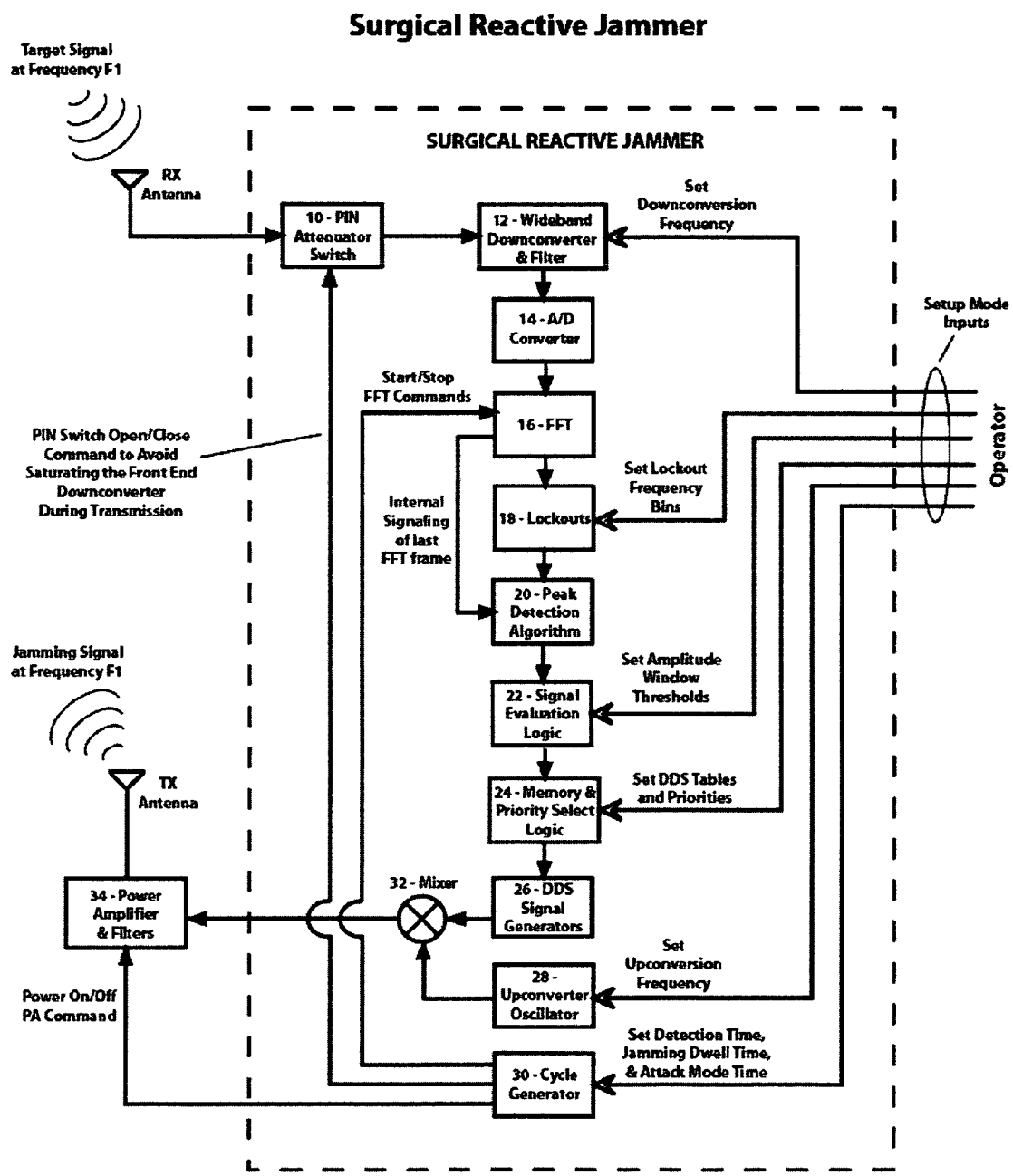

FIGURE 2 - INVENTION
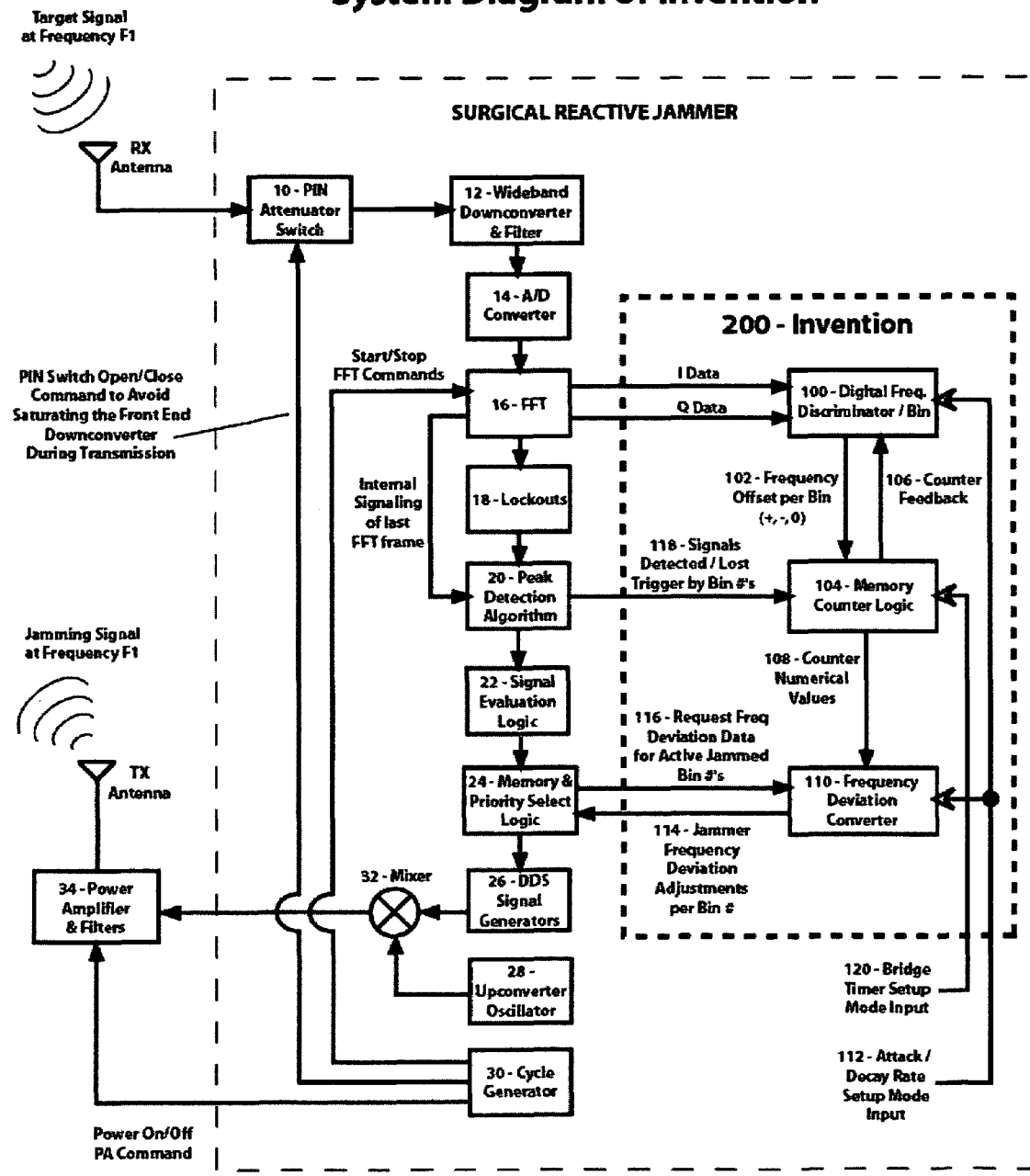

METHOD AND APPARATUS FOR AUTOMATIC JAMMER FREQUENCY CONTROL OF SURGICAL REACTIVE JAMMERS

This application is a continuation-in-part of application Ser. No. 10/912,976, filed Aug. 6, 2004, now pending.

This application is filed within one year of, and claims priority to Provisional Application Ser. No. 60/649,920, filed Feb. 3, 2005.

BACKGROUND OF THE INVENTION

1. Field of the Invention

This invention relates to advanced military grade communications jamming systems and, more specifically, to a Method and Apparatus for Automatic Jammer Frequency Control of Surgical Reactive Jammers.

2. Description of Related Art

Modern military grade communication systems today employ short, burst type transmissions that constantly cycle through a secret sequence of frequencies in order to prevent detection and jamming. Such systems are commonly known as frequency hoppers. Typically, these systems (both foreign and domestic) only transmit on a particular frequency for no more than a few milliseconds at the most. This creates a problem for those who want to detect and jam such transmissions as they happen so quickly. Practically, it is not feasible to simply "splash" the radio frequency spectrum with random noise in order to jam such transmissions. The reasons are that it requires an unpractical amount of power to apply sufficient RF energy to wash out all transmissions. In addition, there may be friendly transmissions that should not be jammed. Also, since the duration of the target transmissions is so short, it is not practical to have (for instance) a CPU that is programmed to evaluate signals, make a determination, and then command transmitters to jam. There is simply not enough time to engage the frequency hopping signals before they have moved on to a new frequency.

This invention relates to an enhanced electronic warfare capability over enemy signals and communications; it is an extension and an augmentation to a previously filed U.S. patent application Ser. No. 10/912,976: "System and Method to Autonomously and Selectively Jam Frequency Hopping Signals in Near Real-Time," also written by this author. That patent will be referenced continually throughout this description.

The jammer device described by patent application Ser. No. 10/912,976 is sometimes referred to in the Electronic Warfare industry as a "wideband reactive jammer", "surgical follower jammer," or a "surgical reactive jammer" because it has the ability to quickly find enemy signals and then very rapidly apply jamming energy right on targets so as to jam those enemy communication signals. This is possible because it uses a wideband digital reception technique to instantaneously detect the presence of enemy signal energy. Once the enemy signals are detected, they are then immediately jammed by using fast direct digital synthesizers to output RF energy right on those detected enemy signal frequencies.

One of the tradeoffs of this sophisticated technology, though, is that to enhance jammer reaction speed, absolute frequency resolution is often sacrificed. Thus, the reactive jammers output signals might not be exactly on target, given that the frequency detected was not completely precise. There are a variety of jammer techniques, which have been invented and employed by this author to overcome this shortcoming. One such unique technique is shifting the jammer frequency very quickly, and pseudo-randomly, across the maximum theoretical error deviation. Thus, the target receiver experiences pulsed frequency and amplitude modulated jamming tones that hit the right frequency most of the time. That technique is the topic of a separate patent application. The other technique is the very topic of this patent application, which is hereby coined as Automatic Jammer Frequency Control (AJFC).

What is needed therefore in order to feasibly detect and jam modem fast narrowband transmissions as efficiently as possible is a system that has not only has: 1) The abilities stated in the aforementioned previous patent application Ser. No. 10/912,976, but also 2) The ability to implement AJFC to fine tune the jammer signals in real time.

FIG. 1 is a functional depiction of a preferred embodiment of the present invention, a near real-time frequency hopper jamming system. Once armed for jamming, the system first receives and instantaneously processes a wide bandwidth of RF spectrum. The invention will then detect short duration signals such as frequency hopping signals and burst transmissions. Such suddenly appearing signals are then automatically evaluated and then automatically jammed by this invention. The combination between the automatic detection of sudden, short duration signals, and the intelligent evaluation and jamming of such signals, was unique until the disclosure of that prior jamming system and method of the parent application to this continuation-in-part.

The system 80 is implemented in hardware and preset by software programming. The system 80 uses a device 12 that is a wideband front-end downconverter (i.e. a radio receiver tuner) that outputs a wideband intermediate frequency (IF). Thus all the signal information contained within the bandwidth of the IF filter can be analyzed instantly. The resulting IF output may contain one or many short duration communication signals. The front-end section of the System utilizes portions of wideband detection technology described by the patent application entitled: "Method And Apparatus For The Intelligent And Automatic Gathering Of Sudden Short Duration Communications Signals" (U.S. patent application Ser. No. 10/829,858). The next sections contain the selection logic by which it is automatically determined whether or not received signals should be jammed. There are various programmable criteria. For example there is a section that determines priority for jamming, as well as a lookup table for jammer programming. The cycle generator section 30 regulates the user configurable System timing. The final section of the invention executes the jamming frequency generation and output (as determined by the previous sections), which must also occur extremely quickly. All of these processes occur in near real time.

Operation

As a high level description, the invention described herein first basically has the hardware and method required to capture high speed frequency hopping transmissions. Then the frequencies of those detected signals are passed along through a series of decision modules to determine whether or not it should be jammed. The signal logic modules of the jammer take those results and strip out the signals that are not of interest. What remains are the signals that should be jammed and are subsequently passed on to the invention's signal generation circuitry for jammer output. All of this occurs automatically and without CPU intervention, everything can be done in hardware.

To jam high speed frequency hoppers requires equipment that has extremely fast and especially precise timing. The invention of that prior patent application uses such a concept and implements it with a hardware module called the cycle generator 30. The jammer system has all of the timing regulated and coordinated by the cycle generator 30, which has its' timers pre-programmed in the Setup Mode. After the Setup Mode is complete and the system is properly "armed" (please see below a discussion of Modes), the operator can begin the Attack Loop Mode by initiating the cycle generator into action which will in turn make the entire jammer system operate autonomously until the jammer is manually turned off by the user, or the attack timer expires.

During operations, a converter device 12 is first tuned to a region of the RF spectrum where the enemy frequency-hopping signals are expected to be. A PIN diode switch 10 is placed on the input to this converter device 12. At first, the PIN diode switch is naturally in the closed, or connected, position to allow signals to pass through and into the converter. Incidently, during the Attack Loop Mode of operations, this switch 10 is commanded open by the cycle generator 30 to protect the converter's 12 front-end amplifiers (so-called "blanking" of the front-end) when the System 80 is transmitting at high power RF.

The converter 12 acts as a down-converter device to properly shift the received spectrum into a usable IF range. The wide band analog IF output is then fed through a bandpass filter and then the filtered analog IF is fed directly into the analog-to-digital (A/D) conversion component 14 for digitization. The digitized IF data is then fed to a hardware logic component that performs fast Fourier transformations (FFT). This FFT module (such as an FPGA device) performs various DSP algorithms. But the FFT function is not initiated until the cycle generator sends it the "Start FFT" command.

When the operator is ready, or upon order from military command, the cycle generator 30 is initiated. This cycle generator then sends the Start FFT command to the FFT module and the "detection timer" begins. This gets the entire jammer going and listening for enemy signals (as described above). The FFT module performs the FFT's and transforms the incoming digitized IF (which is in the time domain) to the frequency domain. The FFT length can be 1024 points or more. The output of eatch FFT bin is digital I and Q data. The I and Q data is combined by a magnitude algorithm which takes the square root of the sum of the individual squared values of I and Q. The result is the normalized amplitude of the I/Q, which is the processed spectrum. Thus the spectrum data is completely in the mathematical real domain, without any imaginary components. The amplitude of the "bins" of the FFT correspond to the signal energy detected in each FFT sample over the total IF bandwidth. Each FFT bin value thus contains the amplitude value over a narrow frequency band.

The output of the FFT module is an FFT bin array of information (so-called FFT frame) that is then fed to another hardware logic component 18 (such as an FPGA) that determines if the incoming spectrums contain signals on frequencies that were preprogrammed to not be jammed. The module takes in the incoming FFT bins and excludes those bins that the user does not want to jam. These "lockouts" are bins that translate to no-jam frequencies of friendly or coalition forces (which are provided during the System pre-programming phase—Setup Mode). These are "fixed" lockouts; there are also "real-time" lockouts that may be applied as a function of the hopping pattern that friendly and coalition forces' radios are expected to use at that current time. These real-time lockouts protect the so-called "fill of the day" hopping pattern so that they are not jammed. The result is that the FFT frame that is allowed to pass will only contain present signals that were not designated to be locked out by the jammer. These lockouts can alternatively be done at a later stage without affecting the function of the jammer. The hardware logic then takes the remaining FFT bins and performs various peak detection algorithms 20 (such as two, three or five-point methods) on the set. This algorithm 20 continually takes in new FFT bins all the time and updates the calculated output values for each bin. This is done to improve the overall signal-to-noise (S/N) of the system to receive the new signals. This process all occurs within the Setup Mode programmable "Detection Time" period. The longer detection time used, the higher signal to noise ratio. After the detection period has expired, the cycle generator sends a "Stop FFT" command to the FFT module 16. The FFT module 16 will finish its current FFT frame generation and then pass them on to the following modules. But after that, there will be no more FFT frame generation until the very next attack cycle begins.

The FFT module 16 then sends a command to the peak detection algorithm module 20 to wait for the final FFT frame to arrive, and then to release the final values of the FFT bins and send them to the signal evaluation algorithm module 22.

This algorithm 22 makes a determination if a signal is present in each of the bins or not by using the user provided "window amplitude threshold settings" as a rule set. The window threshold settings are configurable upper and lower amplitude bounds for a signal to be declared present. These values are input during the Setup Mode phase (described below). If a signal does not land within the configurable window threshold setting, then the signal is not jammed. The idea is to not jam signals that have too high a signal strength, since they are typically considered to be from nearby (friendly) forces. If the signal is too low, then it does not meet the minimum signal threshold requirements. This avoids jamming noise spikes. If one or several targets are identified as suitable to jam by the signal evaluation logic 22, those are then sent to the priority logic algorithm module 24 of the hardware.

This priority logic algorithm module 24 decides which one of the signals (or which group of signals) will be jammed. Priority rules can be either hard coded, or configured by the user during the Setup Mode phase. Some signals might be pre-programmed to have higher importance than others for example. After a determination of which signals to jam has been made, those frequencies are matched to the proper Direct Digital Synthesizer (DDS) programming data that is determined from a lookup table.

Next, the information is then sent, along with the DDS programming data, to a Direct Digital Synthesizer module 26 (DDS) that in turn outputs the required jamming frequency, or frequencies. To program DDS chips may require many CPU operations that would take precious milliseconds to accomplish. Thus, one way to effectively program the DDS chips with enough speed is to have a pre-programmed lookup table of every single DDS programming array of bits that are matched to each and every frequency bin of the final FFT frame that comes out of the priority select logic module 24. Thus, there is no CPU intervention required to program the DDS chips. The DDS frequencies are then generated automatically in FPGA hardware.

The output of the DDS module 26 are jammer signals. The jammer signals are then sent to an upconverter stage that contains a oscillator 28, mixer 32 and output filter. The proper final jamming frequency is then output from the System to the external high power amplifier 34 (PA) for long range transmission.

Operation Modes

As mentioned earlier, this system 80 has two major operational modes, a Setup Mode, and the Attack Loop Mode. In the Setup Mode, the operator inputs several parameters to "arm" the System properly with the right information in order to perform fast reactive jamming. For example, the System is programmed with which specific frequencies are NOT to be jammed (i.e. lockouts). This is important since friendly communications should not be attacked during a jamming cycle. The Setup Mode has several major parameters to be input prior to allowing it to go into Attack Mode.

The first Setup Mode parameter involves the tuning of the wideband downconverter 12. This is necessary so the system can "listen" in the right RF spectrum range where enemy frequency-hopping signals are expected to be.

The second Setup Mode parameter involves the programming of the memory logic, window threshold settings, and the priority selection criterion 24. In addition, the DDS setting tables are pre-loaded. The lockout memory logic 18 contains the frequencies that are "locked out" so the System will not jam those. The jammer also contains the priority selection algorithms 22 that are used to evaluate the amplitudes of the FFT bins to see whether or not there is a signal present. The DDS tables are pre-calculated arrays of DDS programming information. Each element in the array corresponds to a different frequency bin within the processed spectrum. For example, if a signal is detected in bin #45, then that frequency has a proper DDS setting in order to jam that frequency. The DDS table thus contains the proper DDS programming information in order to quickly set the DDS chipset 26 to any frequency that a signal appears on within the IF spectrum. When a jamming signal is identified, the hardware logic 24 does a lookup on the table and feeds the correct DDS programming to the DDS 26 itself. And as mentioned, this in turn automatically makes the DDS output the proper frequency.

This method is employed because to program a DDS chipset 26 to output a frequency would take several cycles for a CPU to execute. And those cycles are too long for jamming a fast frequency hopper. Thus, pre-programming fast memory logic to output the correct DDS input which corresponds to the correct jamming signal frequency is there to make the Attack Loop time short enough to—engage fast frequency hopping signals.

The third Setup Mode parameter involves the tuning of the upconverter oscillator 30. Since the DDS chipset 26 may not have enough frequency range to do full frequency coverage, it may be necessary to do the upconversion in a separate stage. But to prepare it for the Attack Loop Mode, the upconverter oscillator 30 is set in advance so the upconverter will cover the targeted frequency range.

The fourth Setup mode parameters that need to be set involve programming the cycle generator 30. The cycle generator 30 is a set of registers that will command the System during the Attack Loop Mode. This is necessary to orchestrate the series of events in the right times, needed to successfully jam a received signal. One parameter that needs to be set is the detection time. This time is how long the System listens for incoming signals and processes the FFT'S. Another parameter that needs to be set is the jamming transmission ON time, or "jamming dwell time". It is necessary for the System to jam for only a certain dwell time, after which the System needs to see if any of the attacked frequencies have hopped to a new location. And the final parameter that needs to be input is the attack time. The attack time is how long the invention should remain in Attack Loop Mode, before stopping and going back into Setup Mode. A manual stop can also be done at any time.

The cycle generator 30 also provides the physical signaling controls to open and close the input PIN diode switch 10 to protect the front-end downconverter 12. This is done to limit the jammer signal power into the downconverter 12 when the PA 34 is transmitting. The cycle generator 30 also sends the signal commands at the proper microsecond timing in a jamming cycle to turn on the PA 34 at the beginning of the jamming dwell period. It also turns off the PA 34 at the end of the jamming dwell period at the proper microsecond timing. After turning off the PA 34, the cycle generator 30 also opens the PIN diode switch 10 and resets the detection timer. Thus, a whole new jamming cycle can begin. This process loops over and over until the user manually cancels Attack Loop Mode, or until the system attack timer expires.

After all these parameters are set, the operator then commands the invention 80 into the Attack Loop Mode when ready, or ordered to by Military Command. In this mode, the system 80 simply monitors the RF spectrum that it was assigned to. And if any short duration frequency-hopping signal arrives within that range, the system 80 will automatically send out a jamming signal in near real time. As mentioned, the operation continues for a user programmable period of time (attack time), or until the operator manually cancels the Attack Loop Mode and brings the System back into Setup Mode.

What is needed is a modification to this extremely responsive surgical reactive jammer that enables the jammer to more accurately determine the target frequency of the jammer than this prior system can.

SUMMARY OF THE INVENTION

In light of the aforementioned problems associated with the prior devices and methods used by today's military organizations, it is an object of the present invention to provide a Method and Apparatus for Automatic Jammer Frequency Control of Surgical Reactive Jammers.

The growing use of fast frequency-hopping radios and push-to-talk radios magnifies the need to have faster and faster electronic warfare jammers to counter them. To address these types of radios and transceivers, a surgical reactive jammer technology was invented that can instantaneously detect the presence of enemy signal energy and then apply signals hyper reactively so as to jam those enemy communication signals. That surgical reactive jammer technology is described in detail in the previously filed U.S. patent application Ser. No. 10/912,976, also written by this author.

This invention allows a surgical reactive jammer to determine precisely the correct jamming frequency to apply, even though the front-end detection capabilities do not have a high enough frequency resolution. This Automatic Jammer Frequency Control (AJFC) allows the best of both worlds by maximizing the speed at which the jammer first reacts to put out energy generally on target, with also maximizing the absolute frequency accuracy of being precisely on target. This greatly enhances the efficiency and capabilities of a surgical reactive jammer.

It is an object of the present invention to provide this enhancement to surgical reactive jammers. Such a system is unique in that it can automatically calculate the best frequency for a surgical reactive jammer to use against a narrowband target. Such a system is also unique because it can calculate frequency precision with higher resolution than the front end detection equipment is capable of at any given instant. Such a system thus greatly enhances the operational capabilities of surgical reactive jammers by allowing fast speed, yet high precision at the same time.

The preferred system should first have all the abilities of the system described by the previous patent application Ser. No. 10/912,976. Secondly the preferred system should be able to automatically determine the precise frequency of a narrowband target, even if the detection techniques do not have the frequency resolution at any given instant. Thirdly, the preferred system should then automatically apply the right controls to the direct digital synthesizers to continually "nudge" the surgical reactive jammer output signals until they are directly on target. Fourthly, the preferred system should have settable attack rates and decay rates at which it engages a detected narrowband signal. Fifthly, the preferred system should have the ability to wait a configurable amount of time (bridge timer) after a signal is lost before it decrements back to the center frequency position. Sixthly, the preferred system should have the ability to slowly decay its frequency deviation settings upon the loss of a detected target, so that if the target signal appears again, the jammer can engage and get back exactly on frequency faster. Finally, the preferred system should be able to perform all of these functions in real-time.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings, of which:

FIG. 1 shows the prior art of the existing surgical reactive jammer of U.S. patent application Ser. No. 10/912,976; and FIG. 2 depicts the system of FIG. 1, modified with a preferred embodiment of the AJFC loop of the present invention.

DETAILED DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide a Method and Apparatus for Automatic Jammer Frequency Control of Surgical Reactive Jammers.

As discussed at length above, FIG. 1 shows the system diagram of a surgical reactive jammer as described by patent application Ser. No. 10/912,976. The surgical reactive jammer is implemented in hardware and controlled by software programming. This jammer uses a device that has a wideband front-end which can processes the entire intermediate frequency (IF) output at once. Thus all the signal information contained within the bandwidth of the IF filter can be analyzed instantly. The resulting IF output may contain one or many short duration communication signals.

The next section contains the selection logic by which it is automatically determined whether or not the received signal should be jammed. The cycle generator section regulates the user configurable System timing. The final section of the surgical reactive jammer executes the jamming frequency generation and output, which must also occur extremely quickly. All of these processes occur in near real time.

The present invention can best be understood by initial consideration of FIG. 2. FIG. 2 depicts the system of FIG. 1, modified with a preferred embodiment of the AJFC loop of the present invention.

A Frequency Discriminator section 100 is used to determine the frequency offset from center of the bin (i.e. in the detected/target frequency). The information is passed to a Memory Counter section 104. It is in the memory counter section 104 that most of the calculations are done. The Memory Counter is stepped by trigger signals from the Peak Detection Algorithm section 20. From there, the counter values go to the Frequency Deviation Converter section 110. The Frequency Deviation Converter 110 fetches the current offset value for a bin and sends the actual deviation adjustments over to the Priority Select Logic section 24 which programs the direct digital synthesizer (DDS) section. All of these functions are described in more detail in the following Operation section of this disclosure.

DIAGRAM REFERENCE NUMERALS

10 PIN Diode Attenuator Switch
12 Wideband Downconverter and Filters
14 Analog-to-Digital Converter (A/D)
16 Fast Fourier Transformations (FFT's)
18 Lockout Logic
20 Peak Detection Algorithm
22 Signal Evaluation Algorithm
24 Memory and Priority Select Logic
26 Direct Digital Synthesizers (DDS's)
28 Upconverter Oscillator
30 Cycle Generator
32 Mixer
34 High Power Amplifier (PA) and Output Filter
100 Digital Frequency Discriminator per Bin
102 Frequency Offset per Bin (+, −, 0)
104 Memory Counter Logic
106 Counter Feedback
108 Counter Numerical Values
110 Frequency Deviation Converter
112 Attack/Decay Rate Setup Mode Input
114 Jammer Frequency Deviation Adjustments per Bin #
116 Request Frequency Deviation Data for Active Jammed Bin #'s
118 Signals Detected/Lost Trigger by Bin #'s
120 Bridge Timer Setup Mode Input
200 Automatic Jammer Frequency Control System Operation Referring to FIG. 2, the major functional blocks of the invention 200 are referred to here as the "AJFC Loop". The AJFC Loop takes its first data from the fast fourier transformation (FFT) 16. Both real (I) and imaginary (Q) data are sent from the transform process continually to the digital frequency discriminator 100. This is where the frequency discrimination calculation on each I/Q data pair for each frequency bin of the FFT is performed.

The outputs of the digital frequency discriminator 100 are called frequency offsets 102. Each frequency offset 102 for each respective FFT bin will be one of three values: "+", "−", or "Zero". If the frequency offset 102 is a "+", then that means that the actual received frequency is higher than the center position (hereafter referred to as the "centerpoint") of the FFT bin. Each FFT bin has a bandwidth in hertz that corresponds to the maximum sampling frequency divided by the size of the n-point FFT. For example, take the case where each FFT bin resolution is 10 kHz wide. The centerpoint of the FFT bin is then at 5 kHz from both edges of the bin. If for example a signal carrier is 2 kHz above the center of the FFT bin then the I/Q frequency discrimination is output as "+", then that means the signal is located somewhere higher than the centerpoint of that FFT bin. Because of the short duration of the signal and the narrow FFT bandwith, the digital frequency discriminator 100 does not have time to accurately detect exactly how far off center the carrier is, only that is higher in frequency.

The frequency offset per bin output 102 is then sent to the memory counter logic 104. The memory counter logic 104 contains a counter for each and every FFT bin of every stare band the jammer system measures. Each counter will simply hold the latest frequency offset data 102, until it is triggered to count again. When a signal is detected along the normal signal detection chain of the jammer by the peak detection algorithm 20, the peak detection algorithm 20 then is programmed to send a "signals detected" trigger 118 over to the memory counter logic 104. Included with this signals detected/lost trigger 118, is exactly what FFT bin that signal was found in.

Once a bin, or several bins, of the memory counter 104 are triggered, the counters for those bins start counting for that particular bin. All memory counter logic 104 registers start initially from the number zero position. The direction of the counter is determined by the frequency offset 102 data that was received from the digital frequency discriminator 100. Thus, if the frequency offset 102 is "−", then the triggered counter begins counting backwards from 0 to −1, −2, and so on so forth, for as long as the "−" frequency offset 102 is received. If the frequency offset 102 is "+", then the triggered counter begins counting forwards from 0 to +1, +2, and so on so forth, for as long as the "+" frequency offset 102 is received. If the frequency offset 102 is "0", then the triggered counter stops counting in it's last known position and holds that output value.

Continuing now, as the memory counter logic 104 starts counting, a counter feedback signal 106 is sent back to the digital frequency discriminator 100. This is necessary to provide the closed loop control so that the memory counter logic 104 stops counting when it has reached the necessary position that translates to a frequency deviation for the jammer that is correct and on target. To explain further, the memory counter 104 sends back the counter feedback 106 data, which corresponds, to the most recent position of the memory counter logic 104 for that bin. When the digital frequency discriminator 100 takes in the counter feedback 106, it shifts the centerpoint of the FFT bin in accordance with the counter feedback data value 106. Thus, when newest I/Q data is sent to the digital frequency discriminator 100, the calculation of what to output is based upon the shifted centerpoint position within the FFT bin. In essence, the digital frequency discriminator 100 will continue to output a "+" or a "−" until the counter feedback 106 adjust the centerpoint of the FFT bin so that it is identical to the actual position of the narrowband signal. And thus, the frequency offset 102 output will then be "0", and the counter memory logic 104 will subsequently stop counting.

On the other side of the memory counter logic 104 is the frequency deviation converter 110. The memory counter logic 104 continuously sends the counter numerical value 108 to the frequency deviation converter 110. The counter numerical value 108 is the latest value of the output of the counters. It is worthy to note that the counter numerical value 108 and the counter feedback 106 values are identical values. The frequency deviation converter 110 takes in the counter value 108 and then outputs the appropriate frequency offset corresponding to the value 108. An attack/decay rate 112 is input into the frequency deviation converter 110 before the jammer is activated during the Setup Mode. The attack/decay rate input 112 defines the actual number of Hz or kHz that each digit of the counter should be translated into. As an example, if the attack/decay rate input 112 is set for 1.5 kHz, and the present counter numerical value 108 is +3 at that time, then +3 multiplied by 1.5 kHz is +4.5 kHz. Thus, the jammer frequency deviation adjustment 114 will be output as +4.5 kHz to the direct digital synthesizers and the output frequency will be "nudged" over that much. For faster speed engagement, the attack/decay rate 112 input is set to a high number during the Setup Mode. But this has the drawback that the final jammer output frequency might overshoot the center of the narrowband signal. Thus, a balance should be made between attack rate and speed of getting on target frequency. This attack decay value is also sent back to the discriminator 100 to adjust the deviation gain correctly.

Continuing forward, if the jammer logic decides to jam a detected signal, or signals, the priority select logic 24 will send a trigger 116 over to the frequency deviation converter 110 that requests from it to send the latest jammer frequency deviation adjustments 114 for those bins. Thus, even though the frequency deviation converter 110 has all the necessary deviation adjustments, only the frequency deviation adjustments 114 for signals that are being presently jammed will be sent to the synthesizers.

If a communications signal is detected and then subsequently lost, the peak detection algorithm 20 will send a signals lost trigger 118 to the memory counter logic 104. Receipt of that signal 118 will then activate the bridge timer 120. The bridge timer is a configurable amount of time that the counter waits before it starts reverting its value back to the zero position. Basically, it is a "wait time" to see if the signal comes back first. The bridge timer 120 is input during the Setup Mode. Once the bridge timer 120 expires, then the memory counter logic 104 will start to move the counter value towards zero, one step at a time. If the bridge timer 120 has not expired and the detected signal is found again, the timer is reset and the memory counter then acts accordingly to the frequency offset 102 that is received for that revived signal. This feature allows the system to be more sophisticated in that as signals are lost, the last previous frequency offset is held for a while before it decays. Thus, if the signal comes back, then it can attack and get back on the exact target frequency much faster than having to start from the zero position on the memory counter logic 104.

In conclusion, the closed loop control of this invention, the AJFC Loop, allows the jammer to swing the final output frequency incrementally towards the actual received narrowband signal, until the frequencies are close to identical. Then, it will stop on that frequency until the narrowband signal is lost. And after the bridge timer 120 expires, the counter will count back towards the zero position. This bridge timer allows the jammer to react more quickly to the signal if it comes back again. All of these functions are done in real time.

The AJFC of the present invention provides the best of both worlds by maximizing the speed at which the jammer first reacts to put out energy generally on target, with also maximizing the absolute frequency accuracy of being precisely on target. This greatly enhances the efficiency and capabilities of a surgical reactive jammer. Thus, even signals intended for very narrow bandwidth receivers can be jammed exactly on target, even if the frequency resolution of the front end fast Fourier transformation detection modules has a wider bandwidth, which thus cannot instantaneously resolve exactly where the narrowband signal is within the frequency bin.

Thus this invention is unique in its ability to fine-tune the operations of the jamming system to match closely the exact frequency of the detected narrowband targets. This invention is also unique in the efficiency it brings to jamming system operations. This invention is therefore vital to the interests of United States national security as it provides a valuable Electronic Warfare capability.

Applications abound for this capability, from jamming of military grade narrowband frequency hopping radios, to jamming of low-grade narrowband remotely controlled improvised explosive devices that occur suddenly, and at any frequency.

In conclusion, insofar as the inventor is aware, no invention formerly developed provides this unique method and technique for automatic jammer frequency control for surgical reactive jammers.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. An electronic signal jamming system, comprising:
   a wideband signal collection front end, comprising:
      a wideband receiver for receiving RF signals across a broad spectrum;
      a digitizer for creating a continuous stream of digitized data representing said received RF signals;
      a digital data conversion means for converting said digitized data into FFT frequency bins; and
      an automatic frequency control module;
   a signal evaluation logic module, comprising:
      a comparing means for comparing each said frequency bin to configurable preset lockout frequency bins;
      a peak detection means for evaluating and calculating the amplitude value for each bin by using a configurable number of data point samples for each of those bins;
      a windowing means for evaluating and calculating the amplitude value for each bin by using a configurable number of data point samples for each of those bins; and
      a priority selection means for evaluating the prioritization of jammer signal targets based upon configurable settings, said priority selection means further responsive to said automatic frequency control module;
   an internal transmitter also responsive to said comparing, peak detection, windowing, and priority logic for transmitting a jamming signal on said frequency of interest; and
   an internal cycle generator timing circuit for the proper high-speed automatic triggering of all modules of the electronic signal jamming system.

2. The system of claim 1, wherein said automatic frequency control further comprises digital frequency discriminator means for determining an incremental frequency offset in said FFT frequency bins.

3. The system of claim 2, wherein said automatic frequency control further comprises memory counter logic means for iteratively cooperating with said digital frequency discriminator means to determine a total frequency offset in said FFT frequency bins.

4. The system of claim 3, wherein said automatic frequency control further comprises frequency deviation converter means for adjusting said priority selection means responsive to said total frequency offset.

5. The system of claim 4, wherein said priority selection means determines a jamming frequency responsive to said signal evaluation means and said frequency deviation converter.

6. The system of claim 5, wherein said digital data conversion means comprises means for converting said digitized data from a time domain to a frequency domain.

7. The system of claim 6, wherein said digital data conversion means comprises means for converting said frequency domain converted data from separate real and imaginary components to normalized amplitude data.

8. The system of claim 7, wherein said normalized amplitude data is categorized by frequency bins.

9. The system of claim 8, wherein said comparing means comprises comparing data in said frequency bins to frequency lockouts.

10. The system of claim 9, further comprising peak detection means for evaluating the amplitude of said frequency bins.

11. The system of claim 10, wherein said windowing means for evaluating each bin to be within configurable amplitude bound limits.

12. The system of claim 11, further comprising means for comparing said amplitude-evaluated signal to a pre-established signal priority list.

13. The system of claim 12, wherein said signal priority logic means further compares said amplitude-evaluated signal to a real-time priority request.

14. A method for jamming RF signal transmissions, comprising the steps of:
   detecting an analog RF signal transmission;
   digitizing said detected RF signal;
   converting said digitized signal into frequency bins;
   comparing said frequency bins to configurable lockout frequency bins;
   evaluating and calculating the amplitude value for each said bin by using a configurable number of data point samples for each of those bins;
   determining a desired frequency by iteratively analyzing said frequency bins;
   evaluating the prioritization of jammer signal targets based upon configurable settings;
   triggering said start of the conversion of said digitized signals into said desired frequency;
   triggering the end of the conversion of said digitized signals into said desired frequency;
   triggering the release of desired frequency information at the correct time;

triggering of the external power amplifier at the correct time to prepare for jammer signals;

automatic programming of a digital signal generator to generate a jamming signal, said signal generator triggering responsive to said comparing.

15. The method of claim 14, wherein said desired frequency determining step comprises determining an incremental frequency offset between said frequency bin and said detected analog RF signal.

16. The method of claim 15, wherein said desired frequency determining step further comprises iteratively determining said incremental frequency offsets until a total frequency offset between said frequency bin and said detected analog RF signal is determined.

17. The method of claim 16, wherein said desired frequency determining step further comprises converting said total frequency offset into a jammer frequency deviation adjustment.

18. The method of claim 17, wherein said priority evaluation step is responsive to said jammer frequency deviation adjustment.

* * * * *